(12) United States Patent
Lee

(10) Patent No.: US 8,504,903 B2
(45) Date of Patent: Aug. 6, 2013

(54) DATA ERROR CHECK CIRCUIT, DATA ERROR CHECK METHOD, DATA TRANSMISSION METHOD USING DATA ERROR CHECK FUNCTION, SEMICONDUCTOR MEMORY APPARATUS AND MEMORY SYSTEM USING DATA ERROR CHECK FUNCTION

(75) Inventor: Joong Ho Lee, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 213 days.

(21) Appl. No.: 12/970,869

(22) Filed: Dec. 16, 2010

(65) Prior Publication Data

US 2012/0110398 A1    May 3, 2012

(30) Foreign Application Priority Data

Oct. 29, 2010    (KR) .................. 10-2010-0106861

(51) Int. Cl.
*H03M 13/00*    (2006.01)
(52) U.S. Cl.
USPC ........................................................ 714/801
(58) Field of Classification Search
USPC ................................................... 714/718, 801
See application file for complete search history.

(56) References Cited

U.S. PATENT DOCUMENTS

| | | | |
|---|---|---|---|
| 4,464,747 A * | 8/1984 | Groudan et al. | 714/804 |
| 4,747,080 A * | 5/1988 | Yamada | 365/200 |
| 5,313,425 A | 5/1994 | Lee et al. | |
| 5,663,969 A * | 9/1997 | Tsou | 714/805 |
| 7,350,137 B2 * | 3/2008 | Foss et al. | 714/805 |
| 7,636,880 B2 * | 12/2009 | Foss | 714/801 |
| 2003/0014717 A1 | 1/2003 | Yedidia et al. | |
| 2003/0103586 A1 | 6/2003 | Poeppelman et al. | |
| 2005/0262420 A1 | 11/2005 | Park et al. | |
| 2007/0079226 A1 * | 4/2007 | Hoya et al. | 714/801 |
| 2007/0300100 A1 | 12/2007 | Foss | |
| 2008/0313510 A1 * | 12/2008 | Baker | 714/718 |
| 2009/0125763 A1 * | 5/2009 | Chang et al. | 714/719 |

FOREIGN PATENT DOCUMENTS

| | | |
|---|---|---|
| JP | 2002-246917 | 8/2002 |
| JP | 2004-208307 | 7/2004 |
| KR | 10-20020081672 A | 10/2002 |
| KR | 1005782721 B1 | 4/2006 |
| KR | 1020090115188 A | 4/2009 |
| KR | 10-0996770 B1 | 11/2010 |

* cited by examiner

*Primary Examiner* — Yolanda L Wilson
(74) *Attorney, Agent, or Firm* — William Park & Associates Patent Ltd.

(57) ABSTRACT

Various embodiments of a memory system are disclosed. In one exemplary embodiment, the memory system may include a semiconductor memory apparatus configured to generate error check signals in a column direction and a row direction of data groups to be transmitted through a plurality of data input/output terminals in a read operation and output the error check signals together with the data groups, and a memory controller configured to control data read/write operations of the semiconductor memory apparatus, generate error check signals by performing error check in a column direction and a row direction of data groups to be transmitted in a write operation, and provide the error check signals to the semiconductor memory apparatus together with the data groups.

23 Claims, 3 Drawing Sheets

| | DATA | | | | | | | CRC | |
|---|---|---|---|---|---|---|---|---|---|
| DQ0 | q63 | q48 | q47 | q32 | q31 | q16 | q15 | q0 | CRC_0 | 1 |
| DQ1 | q62 | q49 | q46 | q33 | q30 | q17 | q14 | q1 | CRC_1 | 1 |
| DQ2 | q61 | q50 | q45 | q34 | q29 | q18 | q13 | q2 | CRC_2 | 1 |
| DQ3 | q60 | q51 | q44 | q35 | q28 | q19 | q12 | q3 | CRC_3 | 1 |
| DQ4 | q59 | q52 | q43 | q36 | q27 | q20 | q11 | q4 | CRC_4 | 1 |
| DQ5 | q58 | q53 | q42 | q37 | q26 | q21 | q10 | q5 | CRC_5 | 1 |
| DQ6 | q57 | q54 | q41 | q38 | q25 | q22 | q9 | q6 | CRC_6 | 1 |
| DQ7 | q56 | q55 | q40 | q39 | q24 | q23 | q8 | q7 | CRC_7 | 1 |

| | DATA | | | | | | | CRC_C | CRC_R |
|---|---|---|---|---|---|---|---|---|---|
| DQ0 | q00 | q01 | q02 | q03 | q04 | q05 | q06 | q07 | CRC_c0 | CRC_r0 |
| DQ1 | q10 | q11 | q12 | q13 | q14 | q15 | q16 | q17 | CRC_c1 | CRC_r1 |
| DQ2 | q20 | q21 | q22 | q23 | q24 | q25 | q26 | q27 | CRC_c2 | CRC_r2 |
| DQ3 | q30 | q31 | q32 | q33 | q34 | q35 | q36 | q37 | CRC_c3 | CRC_r3 |
| DQ4 | q40 | q41 | q42 | q43 | q44 | q45 | q46 | q47 | CRC_c4 | CRC_r4 |
| DQ5 | q50 | q51 | q52 | q53 | q54 | q55 | q56 | q57 | CRC_c5 | CRC_r5 |
| DQ6 | q60 | q61 | q62 | q63 | q64 | q65 | q66 | q67 | CRC_c6 | CRC_r6 |
| DQ7 | q70 | q71 | q72 | q73 | q74 | q75 | q76 | q77 | CRC_c7 | CRC_r7 |

DATA ERROR CHECK CIRCUIT, DATA ERROR CHECK METHOD, DATA TRANSMISSION METHOD USING DATA ERROR CHECK FUNCTION, SEMICONDUCTOR MEMORY APPARATUS AND MEMORY SYSTEM USING DATA ERROR CHECK FUNCTION

CROSS-REFERENCES TO RELATED APPLICATION

The present application claims priority under 35 U.S.C. §119(a) to Korean Patent Application No. 10-2010-0106861, filed on Oct. 29, 2010 in the Korean Intellectual Property Office, which is incorporated herein by reference as if set forth in its entirety herein.

BACKGROUND

1. Technical Field

This disclosure generally relates to data error check, and more particularly to a data error check circuit, a data error check method, a data transmission method using a data error check function, a semiconductor memory apparatus and a memory system using the data error check function.

2. Related Art

A typical semiconductor circuit may have an error check function for checking whether an error has occurred in data in order to improve data reliability in high speed data transmission One typical error check method is a cyclic redundancy check (CRC) function.

FIG. 1 is a drawing depicting a typical semiconductor circuit having a conventional CRC function, where data transmission is performed through respective data input/output terminals DQ0 to DQ7 at ten unit intervals (UI).

In the ten unit intervals, 8-bit data is assigned to eight unit intervals (or expressed by BL8 (Burst Length=8)), a 1-bit CRC values (CRC_0 to CRC_7) is assigned to a ninth unit interval next to the eight unit intervals, and a tenth unit interval actually not used is assigned. The tenth unit interval may be fixed to a logic high value '1'.

The CRC logic of this typical semiconductor circuit according to the conventional art, for example, has to be expressed in a polynomial form such as $P(x)=x^8+x^5+x^3+x^2+x+1$ in order to detect a multi-bit error such as a single bit error, a double bit error or a triple bit error.

In order to configure the CRC logic, the total 328 2-input XOR gates and 42 polynomial equations are necessary, resulting in an increase in a circuit area.

Furthermore, final CRC values are calculated by passing through a 6-stage XOR gate path, causing 6-stage gate delay.

One problem with typical semiconductor circuits according to the conventional art is that circuit area and error check time are increased due to the equations mandated by the CRC logic.

SUMMARY

Accordingly, there is a need for an improved semiconductor circuit that may obviate the above-mentioned problem. It should be understood, however, that some aspects of the invention may not necessarily obviate the problem.

In the following description, certain aspects and embodiments will become evident. It should be understood that these aspects and embodiments are merely exemplary, and the invention, in its broadest sense, could be practiced without having one or more features of these aspects and embodiments.

In one exemplary embodiment, a data error check circuit is configured to generate error check signals by performing error check with respect to column data sets, wherein the sets comprise a plurality of pieces of data inputted/outputted through a plurality of data input/output terminals.

In another exemplary embodiment, a data error check method includes the steps of: performing first error check on data continuously inputted through a plurality of input terminals every half cycle of a clock signal; performing second error check on data inputted through the plurality of input terminals for every half cycle of the clock signal; and determining whether an error has occurred in data according to a result of the first error check and a result of the second error check.

In another exemplary embodiment, a data transmission method includes the steps of: generating error check signals by performing error check with respect to column data sets and row data sets of a plurality of pieces of data prepared for external transmission; and performing data transmission by putting the error check signals into a plurality of unit intervals assigned to the column data sets.

In another exemplary embodiment, a semiconductor memory apparatus includes: an error check circuit configured to generate error check signals by performing an error check operation in a column direction and a row direction of data groups; an input/output circuit configured to put the error check signals into unit intervals assigned to the data groups and transmit the error check signals; and a core block including a memory area for recording the data groups.

In another exemplary embodiment, a memory system includes: a semiconductor memory apparatus configured to generate error check signals in a column direction and in a row direction, of data groups to be transmitted through a plurality of data input/output terminals in a read operation and to output the error check signals together with the data groups; and a memory controller configured to control data read/write operations of the semiconductor memory apparatus, generate error check signals by performing error check in a column direction and a row direction of data groups to be transmitted in a write operation, and provide the error check signals to the semiconductor memory apparatus together with the data groups.

BRIEF DESCRIPTION OF THE DRAWINGS

The accompanying drawings, which are incorporated in and constitute a part of this specification, explain various embodiments consistent with the invention and, together with the description, serve to explain the principles of the invention.

DETAILED DESCRIPTION

Figure 1:
FIG. 1 is a timing diagram of data transmission using a typical error check function.

Reference will now be made in detail to the exemplary embodiments consistent with the present disclosure, examples of which are illustrated in the accompanying drawings. Wherever possible, the same reference characters will be used throughout the drawings to refer to the same or like parts.

According to an exemplary embodiment, first error check in the column direction and second error check in the row direction are performed with respect to data transmitted through data input/output terminals DQ0 to DQ7 to generate respective error check signals, and the error check signals are transmitted outside through a data bus.

Typically, one unit interval is assigned for an error check signal. That is, as illustrated in FIG. 1, five clock signals CLK are used in order to transmit 8-bit data and a 1-bit error check signal. Therefore, since two unit intervals are assigned to one clock signal, the tenth unit interval is redundant in typical practice.

In this regard, according to an embodiment, two types of error check signals are transmitted using predetermined unit intervals and a redundant unit interval.

Figure 2:
FIG. 2 is a timing diagram of data transmission using an error check function according to an exemplary embodiment.

That is, as illustrated in FIG. 2, according to an embodiment, data transmission including an error check function (that is, a CRC function) may be performed through respective data input/output terminals DQ0 to DQ7 at ten unit intervals (UI).

In the ten unit intervals, data is assigned to eight unit intervals (also expressed by BL8 (Burst Length=8)), a 1-bit column error check signal (CRC_c<0:7>) may be assigned to a ninth unit interval next to the eight unit intervals, and a 1-bit row error check signal (CRC_r<0:7>) is assigned to a tenth unit interval.

In the above-described embodiment, the 1-bit row error check signal (CRC_r<0:7>) may be assigned to the tenth unit interval. However, the 1-bit row error check signal (CRC_r<0:7>) may also be assigned to the ninth unit interval and the 1-bit column error check signal (CRC_c<0:7>) may also be assigned to the tenth unit interval.

The column error check signals (CRC_c<0:7>) may be generated by performing error check with respect to data sets q00 to q07, q10 to q17, . . . , q70 to q77 in the column direction of the data input/output terminals DQ0 to DQ7.

The row error check signals (CRC_r<0:7>) may be generated by performing error check with respect to data sets q00 to q70, q01 to q71, . . . , q07 to q77 in the row direction of the data input/output terminals DQ0 to DQ7.

Hereinafter, an error check signal generation circuit for generating the column error check signals (CRC_c<0:7>) and the row error check signals (CRC_r<0:7>) by performing the error check in the column direction and the row direction will be described.

An error check signal generation circuit 314 according to an exemplary embodiment, which is a CRC logic includes a first generation unit 315 and a second generation unit 316.

The first generation unit 315 may be configured to generate the column error check signals (CRC_c<0:7>) by performing the error check with respect to the data sets q00 to q07, q10 to q17, . . . , q70 to q77 in the column direction of the data input/output terminals DQ0 to DQ7.

The first generation unit 315 may be configured to generate the column error check signals (CRC_c<0:7>) by performing an XOR operation on all data of the respective data sets q00 to q07, q10 to q17, . . . , q70 to q77 in the column direction of the data input/output terminals DQ0 to DQ7.

The first generation unit 315 may include seven 2-input XOR gates provided to each data set in the column direction, that is, the total 56 2-input XOR gates.

The second generation unit 316 may be configured to generate the row error check signals (CRC_r<0:7>) by performing the error check with respect to the data sets q00 to q70, q01 to q71, . . . , q07 to q77 in the row direction of the data input/output terminals DQ0 to DQ7.

The second generation unit 316 may be configured to generate the row error check signals (CRC_r<0:7>) by performing an XOR operation on all data of the respective data sets q00 to q70, q01 to q71, . . . , q07 to q77 in the row direction of the data input/output terminals DQ0 to DQ7.

The second generation unit 316 may include seven 2-input XOR gates provided to each data set in the row direction, that is, the total 56 2-input XOR gates.

As a result, according to an exemplary embodiment, the total 112 2-input XOR gates are used in order to configure the CRC logic, so that a circuit area is relatively reduced by about ⅓ as compared with the convention art requiring the total 328 2-input XOR gates. In other words, circuit area efficiency can be increased about three times.

Furthermore, according to an exemplary embodiment, the final CRC values, or the column error check signals (CRC_c<0:7>) and the row error check signals (CRC_r<0:7>), are calculated by passing through the 3-stage XOR gate path, so that it is possible to generate error check signals as fast as twice as compared with the convention art requiring the 6-stage XOR gate path.

According to the embodiment described above, it may be possible to reduce a circuit area and an error check time as compared with typical systems while substantially maintaining error check capability substantially equal to that according to typical systems, which will be described in detail below.

A method for detecting a single bit error will be described below.

By means of example, it is assumed that "01000110" is inputted through the DQ0, an error occurs in the first data, and CRC_c<0>=0 is inputted.

As a result obtained by performing error check with respect to the data "01000110" inputted through the DQ0, CRC_c<0>=1. Thus, since the received CRC_c<0> is different from the CRC_c<0> calculated as above, it may be possible to detect the single bit error.

In the same manner as the case of the CRC_c<0>, the single bit error may be detected through the CRC_r<0>.

A method for detecting a mufti-bit error such as, for example, a double bit error, will be described below.

When the double bit error has occurred in an $i^{th}$ DQ, error detection is not possible through CRC_c<i>. However, it may be possible to detect the double bit error by detecting a single bit error through CRC_r<j> and CRC_r<k>.

By means of example, assuming that data "00000110" is inputted through the DQ0, an error occurs in the first data and the second data, and CRC_c<0>=0 is inputted.

As a result obtained by performing error check with respect to the data "00000110" inputted through the DQ0, CRC_c<0>=0. Thus, since the received CRC_c<0> is substantially equal to the CRC_c<0> calculated as above, it is not possible to detect the double bit error.

However, since data other than the data inputted through the DQ0 is normal, a single bit error is detected through CRC_r<0> and CRC_r<1>, so that it is possible to detect the double bit error.

A method for detecting a multi-bit error such as, for example, a triple bit error, will be described below.

When the triple bit error has occurred in an $i^{th}$ DQ, a single bit error is detected through CRC_c<i> and is also detected through CRC_r<j>, CRC_r<k> and CRC_r<l>, so that it is possible to detect the triple bit error.

The above-described error check function is available for a semiconductor memory apparatus or a memory system which performs data transmission.

Hereinafter, a semiconductor memory apparatus or a memory system according to another exemplary embodiment will be described.

Figure 4:
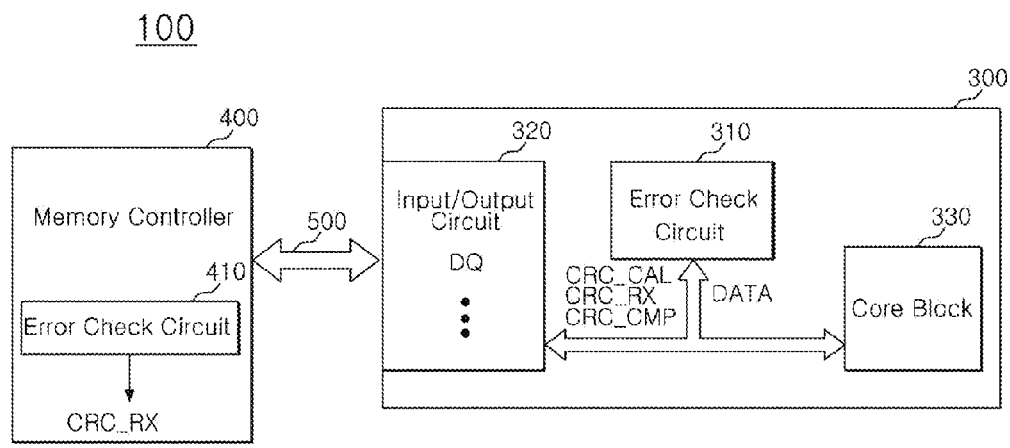
FIG. 4 is a block diagram of a memory system according to an exemplary embodiment.

FIG. 4 illustrates a memory system 100 according to another exemplary embodiment, which includes a semiconductor memory apparatus 300 and a memory controller 400.

The semiconductor memory apparatus 300 may be configured to generate error check signals in the column direction and the row direction of data groups to be transmitted through a plurality of data input/output terminals DQ0 to DQ7 in response to a read command, and to output the error check signals together with the data groups.

The semiconductor memory apparatus 300 may be configured to put the error check signals into a redundant unit interval of the entire unit intervals assigned to the data groups and transmit the error check signals.

The semiconductor memory apparatus 300 may be configured to generate error check signals in the column direction and the row direction of data groups received through the plurality of data input/output terminals DQ0 to DQ7 in response to a write command, and compare the error check signals with error check signals received together with the data groups to check whether an error has occurred in the data groups, thereby controlling a data write operation. Furthermore, the semiconductor memory apparatus 300 may be configured to provide the memory controller 400 with error check information of the received data groups.

The semiconductor memory apparatus 300 includes an error check circuit 310, an input/output circuit 320, and a core block 330.

The error check circuit 310 may be configured to generate an error check signal CRC_CAL by performing an error check operation in the column direction and the row direction of data groups.

The error check circuit 310 may be configured to generate a comparison signal CRC_CMP by comparing an external error check signal CRC_RX with the error check signal CRC_CAL generated therein.

The input/output circuit 320 may include the plurality of data input/output terminals DQ0 to DQ7. Furthermore, the input/output circuit 320 may include a circuit configuration related to data input/output.

The input/output circuit 320 may be configured to put the error check signal CRC_CAL into the entire unit intervals assigned to the data groups and transmit the error check signal CRC_CAL.

The input/output circuit 320 may be coupled to the memory controller 400 through a communication bus 500. The communication bus 500 may include buses for data, addresses, and commands.

The core block 330 may include a memory area for data recording and various circuit configurations for recording data on the memory area or outputting recorded data.

The memory controller 400 may be configured to control data read/write operations of the semiconductor memory apparatus 300, generate an error check signal CRC_RX by performing error check in the column direction and the row direction of data groups in a write operation, and provide the error check signal CRC_RX to the semiconductor memory apparatus 300 together with the data groups.

The error check circuit 310 of the semiconductor memory apparatus 300 and an error check circuit 410 of the memory controller 400 may be configured using the error check method as described with reference to FIGS. 2 and 3.

Figure 5:
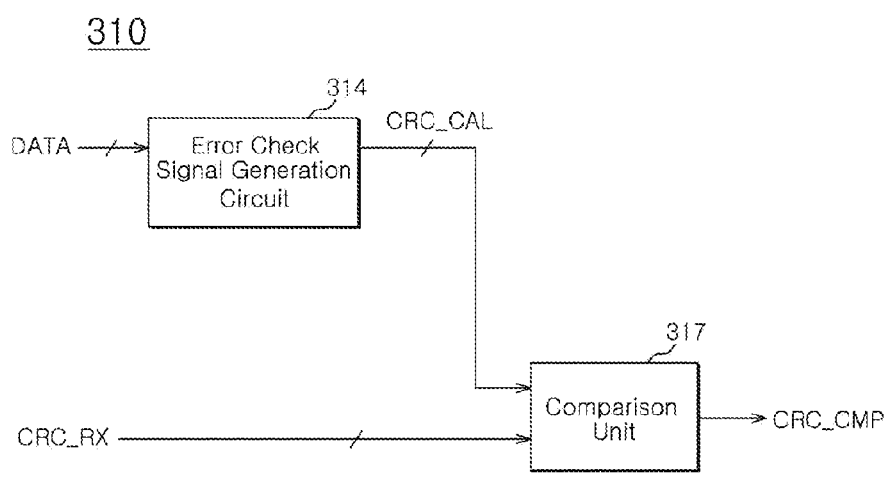
FIG. 5 is a block diagram illustrating the internal configuration of the error check circuit illustrated in FIG. 4 according to an exemplary embodiment.

FIG. 5 illustrates the error check circuit 310, which includes an error check signal generation circuit 314 and a comparison unit 317.

The error check signal generation circuit 314 may be configured to generate the error check signal CRC_CAL by performing the error check operation in the column direction and the row direction of the data groups.

Figure 3:
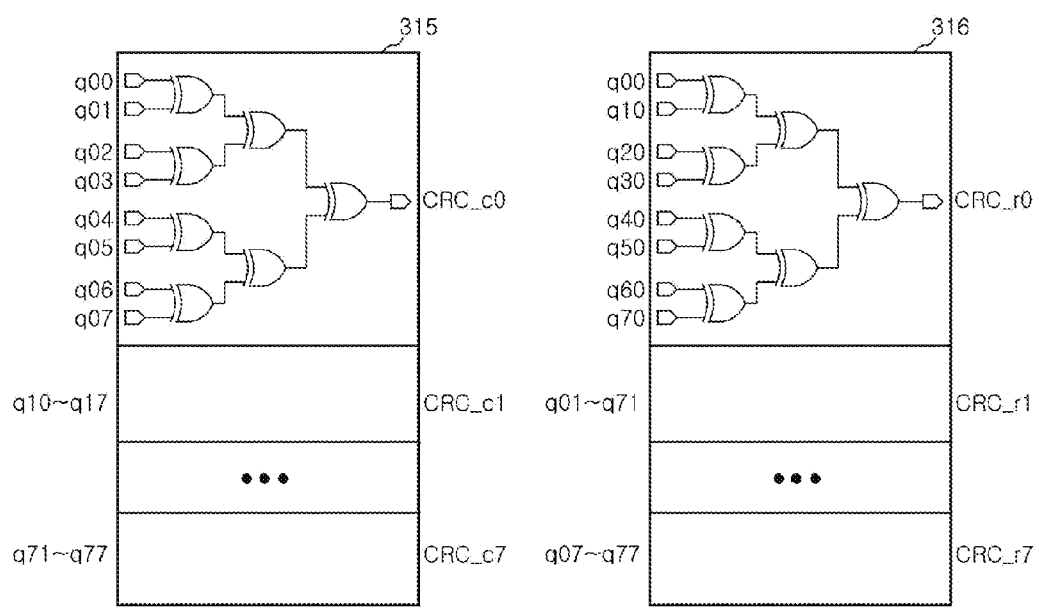
FIG. 3 is a circuit diagram of an error check signal generation circuit according to an exemplary embodiment.

The error check signal generation circuit 314 may be configured as illustrated in FIG. 3. Accordingly, the error check signal CRC_CAL may include the column error check signals (CRC_c<0:7>) and the row error check signals (CRC_r<0:7>).

The comparison unit 317 may be configured to generate the comparison signal CRC_CMP by comparing the error check signal CRC_RX provided by the memory controller 400 with the error check signal CRC_CAL outputted from the error check signal generation circuit 314.

The comparison signal CRC_CMP may be used as error check information. Accordingly, the comparison signal CRC_CMP may be provided to the core block 330 or the input/output circuit 320 in order to reduce erroneous data from being recorded on the semiconductor memory apparatus 300. Furthermore, the comparison signal CRC_CMP may be provided to the memory controller 400 in order to request data retransmission.

The operation of the memory system 100 having the above configuration according to an exemplary embodiment will be described below.

In the case of a write operation, the memory controller 400 may generate an error check signal CRC_RX by performing error check in the column direction and the row direction of data.

The memory controller 400 provides the semiconductor memory apparatus 300 with data and the error check signal CRC_RX through a data bus.

At this time, the error check signal CRC_RX, that is the column error check signals (CRC_c<0:7>) and the row error check signals (CRC_r<0:7>) are transmitted to a ninth unit interval and a redundant tenth unit interval of the 10 unit intervals assigned for data transmission in each DQ.

The semiconductor memory apparatus 300 receives the data and the error check signal CRC_RX through the data bus.

The error check circuit 310 of the semiconductor memory apparatus 300 generates an error check signal CRC_CAL by performing error check in the column direction and the row direction of the received data, and generates a comparison signal CRC_CMP by comparing the error check signal CRC_CAL with the error check signal CRC_RX.

When the comparison signal CRC_CMP is at a level which defines that the error check signal CRC_CAL does not coincide with the error check signal CRC_RX, data write of the semiconductor memory apparatus 300 is stopped and a data retransmission request is transmitted to the memory controller 400.

In the case of a read operation, the error check circuit 310 of the semiconductor memory apparatus 300 generates an error check signal CRC_CAL by performing error check in the column direction and the row direction of data to be transmitted.

The semiconductor memory apparatus 300 may provide the memory controller 400 with data and the error check signal CRC_CAL through the data bus.

At this time, the error check signal CRC_CAL, that is, the column error check signals (CRC_c<0:7>) and the row error check signals (CRC_r<0:7>) are transmitted to a ninth unit interval and a redundant tenth unit interval of the 10 unit intervals assigned for data transmission in each DQ.

While certain embodiments have been described above, it will be understood to those skilled in the art that the embodiments described are by way of example only. Accordingly, the data error check circuit, the data error check method, the data transmission method using the data error check function, and the semiconductor memory apparatus and the memory system using the data error check function described herein should not be limited based on the described embodiments. Rather, the data error check circuit, the data error check method, the data transmission method using the data error check function, and the semiconductor memory and the memory system using the data error check function described herein should only be limited in light of the claims that follow when taken in conjunction with the above description and accompanying drawings.

What is claimed is:

1. A semiconductor memory apparatus comprising a data error check circuit, wherein the data error check circuit is configured to generate error check signals by performing error checks with respect to column data sets and row data sets, wherein the sets comprise a plurality of pieces of data inputted or outputted through a plurality of data input/output terminals,
wherein the error checks are simultaneously performed at every half cycle of a clock signal.

2. The semiconductor memory apparatus according to claim 1, wherein the data error check circuit comprises:
a first generation unit configured to generate column error check signals by error checking with respect to the column data sets; and
a second generation unit configured to generate row error check signals by error checking with respect to the row data sets.

3. The semiconductor memory apparatus according to claim 1, wherein the data error check circuit includes a plurality of XOR gates and wherein the data error check circuit is configured to generate the error check signals by performing an operation with respect to the column data sets and the row data sets through the plurality of XOR gates.

4. A data error check method comprising the steps of:
performing first error check on data continuously inputted through a plurality of input terminals every half cycle of a clock signal;
performing second error check on data inputted through the plurality of input terminals every half cycle of the clock signal; and
determining whether an error has occurred according to a result of the first error check and a result of the second error check.

5. The data error check method according to claim 4, wherein the first error check and the second error check are performed by performing an XOR operation.

6. The data error check method according to claim 4, wherein the step of determining whether the error has occurred includes detecting a single bit error according to the result of the first error check.

7. The data error check method according to claim 4, wherein, in the step of determining whether the error has occurred includes detecting a multi-bit error by combining the result of the first error check with the result of the second error check.

8. A data transmission method comprising the steps of:
generating error check signals by performing error checks with respect to column data sets and row data sets of a plurality of pieces of data prepared for external transmission; and
performing data transmission by putting the error check signals into a plurality of unit intervals assigned to the column data sets,
wherein the error checks are simultaneously performed at every half cycle of a clock signal.

9. The data transmission method according to claim 8, wherein, in the step of generating the error check signals, the error check signals include a result obtained by performing an XOR operation on the column data sets and the row data sets.

10. The data transmission method according to claim 8, wherein the error check signals include column error check signals and row error check signals, and
wherein, in the step of performing the data transmission, one of the column error check signals and the row error check signals is put into a redundant unit interval of the plurality of unit intervals.

11. A semiconductor memory apparatus comprising:
an error check circuit configured to generate error check signals by performing error check operations in a column direction and a row direction of data groups;
an input/output circuit configured to put the error check signals into unit intervals assigned to the data groups and transmit the error check signals; and
a core block including a memory area for recording the data groups,
wherein the error check operations are simultaneously performed at every half cycle of a clock signal.

12. The semiconductor memory apparatus according to claim 11, wherein the error check circuit is configured to generate a comparison signal by comparing external error check signals with the error check signals generated therein.

13. The semiconductor memory apparatus according to claim 12, wherein the comparison signal is provided to the core block or the input/output circuit in order to reduce erroneous data from being recorded on the semiconductor memory.

14. The semiconductor memory apparatus according to claim 11, wherein the input/output circuit includes a data input/output terminal for transmitting data sets in the column direction of the data groups according to the unit intervals.

15. The semiconductor memory apparatus according to claim 14, wherein the error check signals include column error check signals and row error check signals, and
wherein the input/output circuit is configured to put the data sets in the column direction, the column error check signals and the row error check signals into unit intervals assigned to the data sets in the column direction, and transmit the data sets in the column direction, the column error check signals and the row error check signals.

16. A memory system comprising:
a semiconductor memory apparatus configured to generate error check signals, in a column direction and in a row direction, of data groups to be transmitted through a plurality of data input/output terminals in a read operation and to output the error check signals together with the data groups; and
a memory controller configured to control data read/write operations of the semiconductor memory apparatus, generate error check signals by performing error checks in a column direction and a row direction of data groups to be transmitted in a write operation, and provide the error check signals to the semiconductor memory apparatus together with the data groups,
wherein the error checks are simultaneously performed at every half cycle of a clock signal.

17. The memory system according to claim 16, wherein the semiconductor memory apparatus is configured to put the error check signals generated by the semiconductor memory apparatus into unit intervals assigned to the data groups to be transmitted in the read operation and output the error check signals through the plurality of data input/output terminals.

18. The memory system according to claim 16, wherein the semiconductor memory apparatus is configured to generate error check signals in a column direction and a row direction of data received through the plurality of data input/output terminals, and to compare the error check signals with the error check signals provided by the memory controller to check whether an error has occurred in the data groups, thereby controlling a data write operation.

19. The memory system according to claim 18, wherein the error check circuit comprises:
   an error check signal generation circuit configured to generate the error check signals by performing the error checks in the column direction and in the row direction of the data groups; and
   a comparison unit configured to generate a comparison signal by comparing external error check signals with the error check signals generated by the error check circuit generation circuit.

20. The memory system according to claim 19, wherein the comparison signal is provided to a core block or data input/output terminals in order to reduce erroneous data from being recorded on the semiconductor memory apparatus.

21. The memory system according to claim 16, wherein the semiconductor memory apparatus is configured to provide the memory controller with a result obtained by checking whether the error has occurred.

22. The memory system according to claim 16, wherein the semiconductor memory apparatus comprises:
   an error check circuit configured to generate the error check signals by performing error check operations in the column direction and in the row direction of the data groups;
   a plurality of data input/output terminals configured to put the error check signals into unit intervals assigned to the data groups and transmit the error check signals externally; and
   a core block including a memory area for recording the data groups.

23. The memory system according to claim 16, wherein the memory controller is configured to put the error check signals generated by the memory controller into unit intervals assigned to the data groups to be transmitted in the write operation and provide the semiconductor memory apparatus with the error check signals.

* * * * *